United States Patent [19]
Hotta et al.

[11] Patent Number: 6,117,513
[45] Date of Patent: Sep. 12, 2000

[54] SEMICONDUCTOR DEVICE AND A LAMINATION AND FIXING MATERIAL USED IN THE METHOD OF MANUFACTURE OF THE SEMICONDUCTOR DEVICE

[75] Inventors: Yuuji Hotta; Hitomi Shigyo, both of Osaka, Japan

[73] Assignee: Nitto Denk Corporation, Osaka, Japan

[21] Appl. No.: 08/856,877

[22] Filed: May 15, 1997

Related U.S. Application Data

[62] Division of application No. 08/421,253, Apr. 13, 1995, Pat. No. 5,674,343.

[30] Foreign Application Priority Data

| Apr. 19, 1994 | [JP] | Japan | ................................. 6-80158 |
| Jun. 29, 1994 | [JP] | Japan | ................................ 6-147458 |
| Aug. 24, 1994 | [JP] | Japan | ................................ 6-199357 |

[51] Int. Cl.⁷ ............................ B32B 3/10; H01L 23/544
[52] U.S. Cl. ......................... 428/67; 257/678; 257/729; 428/42.1; 428/209
[58] Field of Search .................. 428/40.9, 41.8, 428/42.1, 67, 209, 606, 614, 620, 687, 914; 29/592.1; 174/255, 259; 257/729; 101/DIG. 31; 264/79, 272.17, 241, 247, 263, 271.1, 275; 438/124, 127

[56] References Cited

U.S. PATENT DOCUMENTS

| 2,625,496 | 1/1953 | Swift et al. ........................ 428/42.1 X |
| 2,765,248 | 10/1956 | Beech et al. ............................. 156/232 |
| 3,067,071 | 12/1962 | Mutter ................................ 428/620 X |
| 3,085,295 | 4/1963 | Pizzino et al. ................. 264/272.17 X |
| 3,444,309 | 5/1969 | Dunn ..................................... 174/52.2 |
| 3,715,423 | 2/1973 | Dunn ..................................... 264/250 |
| 4,062,917 | 12/1977 | Hill et al. ............................... 264/102 |
| 4,350,654 | 9/1982 | Yoshida .................................. 264/129 |
| 4,773,677 | 9/1988 | Plasse ....................................... 283/77 |
| 4,994,224 | 2/1991 | Itoh et al. .............................. 264/247 |
| 5,110,628 | 5/1992 | Ganapol et al. ....................... 427/256 |
| 5,370,760 | 12/1994 | Mori et al. ............................... 156/89 |
| 5,521,436 | 5/1996 | Temple .................................... 257/698 |
| 5,528,825 | 6/1996 | Miyauchi et al. ........................ 29/837 |
| 5,539,976 | 7/1996 | Miyauchi et al. ........................ 29/740 |
| 5,604,006 | 2/1997 | Ponchaud et al. ....................... 428/67 |
| 5,723,905 | 3/1998 | Coico et al. ............................ 257/704 |

*Primary Examiner*—Francis J. Lorin
*Attorney, Agent, or Firm*—Sughrue, Mion, Zinn, Macpeak & Seas, PLLC

[57] ABSTRACT

A method of manufacturing a semiconductor and a lamination therefor, in which fixing materials are temporarily fixed to the molding faces of a mold through release films. The semiconductor element is then placed in the mold and molding resin is injected into the mold. The resin is heated to produce the semiconductor device. During this process, the fixing materials become embedded in each of the opposite surfaces of the resin.

13 Claims, 3 Drawing Sheets his is a divisional of application Ser. No. 08/421,253 filed Apr. 13, 1995 now U.S. Pat. No. 5,674,343.

BACKGROUND OF THE INVENTION

1. Field of the Invention

The present invention relates to a method for manufacturing a semiconductor device wherein fixing materials are fixed on a surface of a package in which a semiconductor element is sealed with resin; a lamination and fixing materials used in the method; and a semiconductor device provided with fixing materials.

2. Description of Related Art

Conventionally, semiconductor devices such as transistors, ICs and LSIs have been sealed by the use of ceramic packages. Recently, in order to reduce costs and to facilitate mass production, among other reasons, semiconductor devices of the resin-sealed type using plastic packages have been widely used. In this type of resin-sealed semiconductor device, epoxy resin has been popular as a molding resin and has achieved good results. Technological innovation has resulted in the degree of integration of these semiconductors becoming higher and the layer dimensions becoming larger, and a strong demand has developed to reduce the dimensions of the packages. To this end, the volume ratio of the sealing resin material to the overall package has become small. Accordingly, there has arisen a further demand for improvement of the sealing resin characteristics, for example, in connection with the reduction in thermal stress, the reliability of moisture proofing, and the ability to withstand thermal shock.

More specifically, there has been a recent trend to increase the sizes of semiconductor elements, requiring a further improvement in the performance of semiconductor sealing resin with regard to the thermal cycle test (TCT test), which is an acceleration test for evaluating the performance of the semiconductor sealing resin. Further, surface mounting has become a common method for mounting a semiconductor package onto a circuit wiring board, resulting in a need for the semiconductor to resist cracking and bulging when it is dipped into molten solder after it has absorbed humidity.

In response to these demands and requirements, conventionally, in order to improve the respective characteristics evaluated in the TCT test, attempts have been made to use a silicone compound which may deform the epoxy resin to reduce thermal stress. Attempts have also been made to bring the semiconductor into tight contact with a lead frame in order to improve the anti-crack property required when a semiconductor package is dipped into molten solder. However, the results of these attempts have not been sufficient.

SUMMARY OF THE INVENTION

The present invention has, therefore, an object to provide a method for manufacturing a semiconductor device which is superior in moisture resistance, thermal resistance, and thermal shock resistance when a plastic package is dipped into molten solder, and which has high reliability, even when the plastic package is made thin.

According to a first aspect of the present invention, a method for manufacturing a semiconductor device wherein fixing materials are fixed on a surface of a package in which a semiconductor element is sealed with resin, is characterized by the steps of: provisionally fixing the fixing materials on molding faces of a package forming metal mold; setting the semiconductor element in the metal mold; injecting molding resin into the metal mold; and heating the resin to thereby produce the semiconductor device.

According to a second aspect of the present invention, the method for manufacturing a semiconductor device in which fixing materials are fixed on a surface of a package in which a semiconductor element is sealed with resin, is characterized by the steps of: provisionally fixing the fixing materials on molding faces of a package forming metal mold through release films having mold releasing property with respect to molding resin; setting the semiconductor element in the metal mold; injecting the molding resin into the metal mold; and heating the resin to produce the semiconductor device.

According to a third aspect of the present invention, the method for manufacturing a semiconductor device in which fixing materials are fixed on a surface of a package in which a semiconductor element is sealed with resin, is characterized by the steps of: setting the semiconductor element in a package forming metal mold together with composite sheets in each of which a fixing material and a layer of molding resin are formed through a release film having mold releasing property with respect to the molding resin; and melting the resin to produce the semiconductor device.

BRIEF DESCRIPTION OF THE DRAWINGS

The preferred embodiments are described with reference to the drawings wherein.

DETAILED DESCRIPTION OF THE PREFERRED EMBODIMENTS

A first embodiment of the present invention will now be described with reference to FIGS. 1A to 1D.

Figure 1A:
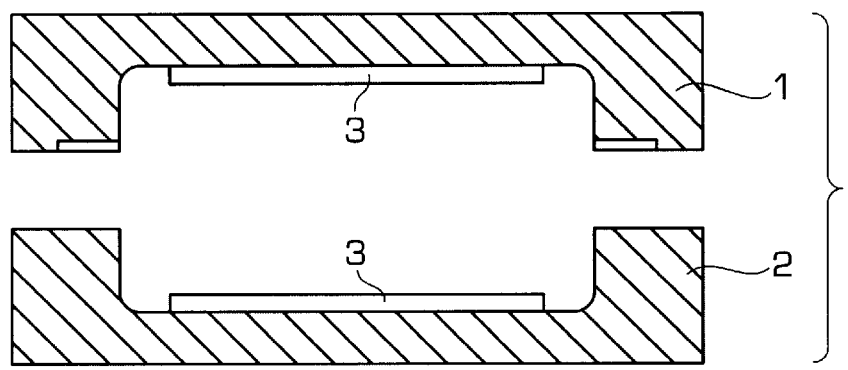
FIG. 1 shows steps used in manufacturing a semiconductor device according to an aspect of the present invention.
Figure 1B:
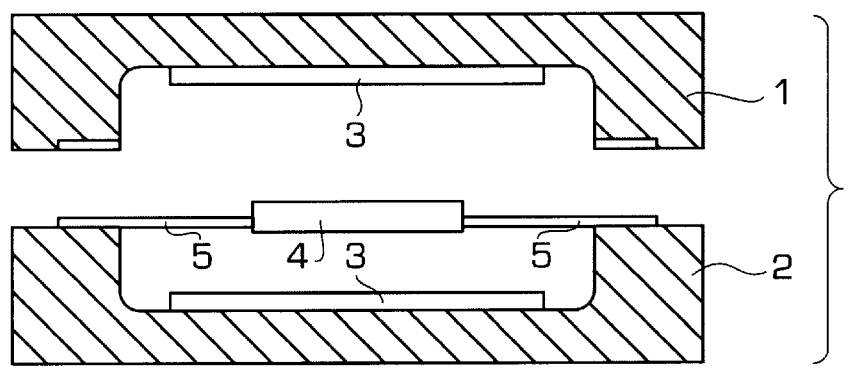
Figure 1C:
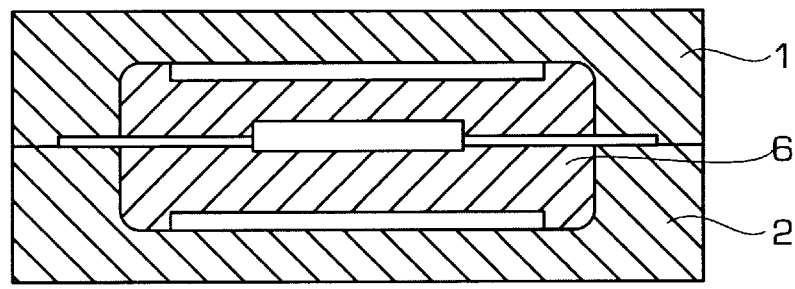
Figure 1D:
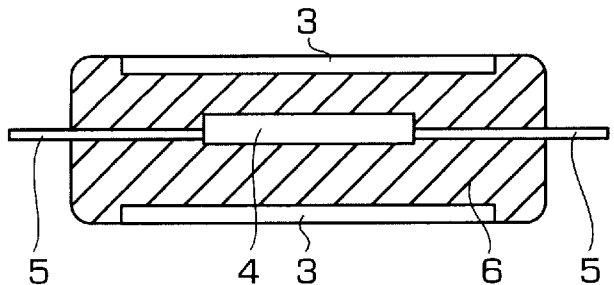

As illustrated in FIG. 1A, metal foil 3 which functions as a fixed material is provisionally fixed on a molding face of each of opened metal mold parts 1 and 2. Next, as illustrated in FIG. 1B, a semiconductor element 4 with a lead frame 5, which should be sealed, is supplied into the inside of the metal mold parts 1 and 2. As shown in FIG. 1C, after the metal mold parts 1 and 2 are closed, resin 6 is injected into the metal mold. Then, the metal mold parts 1 and 2 are opened, and a semiconductor package in which the metal foil 3 is embedded in each of the opposite surfaces of the resin 6, as shown in FIG. 1D, is taken out.

INVENTIVE EXAMPLE NUMBER 1

As a specific example of the first embodiment of the invention, an epoxy resin compound was used, a semiconductor element was subjected to transfer molding (under the condition of setting after heat treatment at 175° C. for 2 minutes and at 175 C. for 5 hours), a fixing material was aluminum foil, with a thickness of 40 $\mu$m of phenoxy resin (Tg=100° C. or less) coated on its surface as a provisionally fixing adhesive agent, the phenoxy resin having tension shear strength within a range of from 0.10 to 5.0 Kgf/cm$^2$ with respect to a #280 polished stainless steel plate. Then the aluminum foil was provisionally fixed in the inside of each of the metal mold parts 1 and 2. Subsequently, resin was injected into the metal mold in accordance with an ordinary method, and then heat-molding was performed. In the thus obtained semiconductor package, as shown in. FIG. 1D, the metal foil was embedded in each of the opposite surfaces of the resin. Further, the semiconductor element employed in this experiment was molded in an 80-pin, 4-way flat package (80-pin QFP, size of 20×14×2 mm), the size of the die pad was 8 mm×12 mm, and the size of the foil was 18 mm×12 mm.

COMPARATIVE EXAMPLE 1

For the purpose of comparison, a semiconductor package not covered with aluminum foil was produced. The measurement results of the Inventive Example 1 and the comparative example 1 are shown in Table 1.

TABLE 1

|  |  |  | Inventive Example 1 | Comparative Example 1 |
|---|---|---|---|---|
| Frequency of occurrence of cracks in TCT test (pieces/10 pieces) | Number of cycles | 2000 4000 8000 | 0 1 1 | 7 10 10 |
| Frequency of occurrence of cracks in anti-crack test in dipping in molten solder (pieces/10 pieces) | Time of moisture absorption | 86h 144h 192h | 1 2 4 | 9 10 10 |

INVENTIVE EXAMPLE 2

Example 2 of the present invention will be described below with reference to FIGS. 2A to 2C.

Figure 2A:
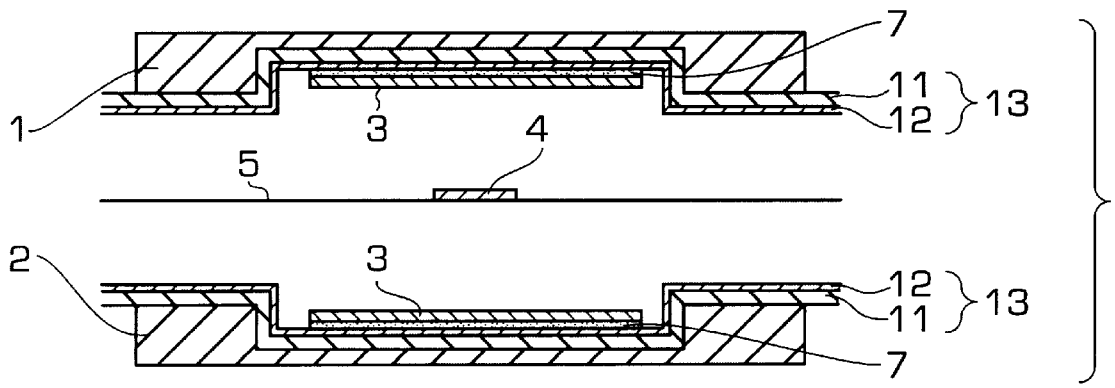
FIG. 2 shows steps for manufacturing a semiconductor device according to another aspect of the present invention.
Figure 2B:
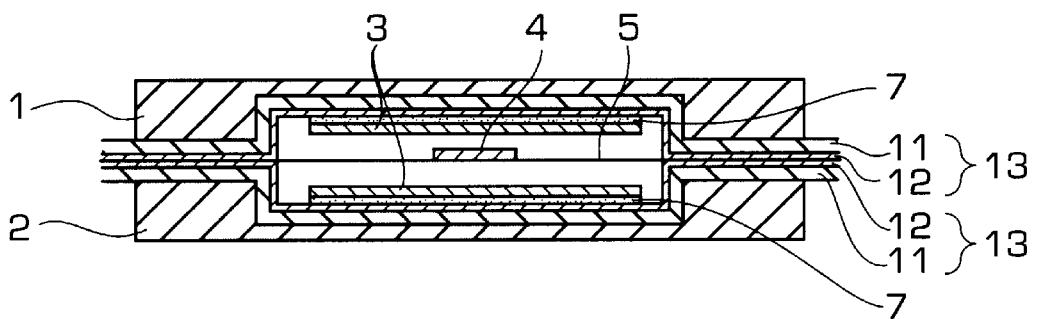
Figure 2C:
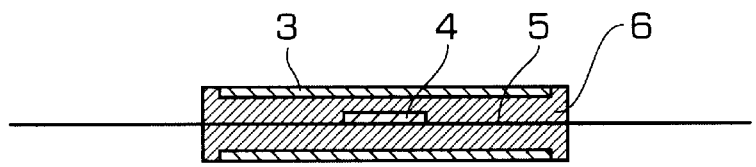

As shown in FIG. 2A, a lamination 13 was set on the molding face of each of the opened metal mold parts 1 and 2. In the lamination 13, aluminum foil (30 $\mu$m thick) 3 acting as a fixing material was provisionally fixed, via a provisionally fixing adhesive agent layer 7 having a thickness of 10 $\mu$m and made of rubber-epoxy resin, onto a surface of a resin layer 12 of a release film 13 which was constituted by a supporting film (50 $\mu$m thick polyester film) 11, and the silicone resin layer (0.3$\mu$ thick) 12 formed on the surface of the supporting film 11. This silicone resin layer 12 had release property with respect to the molding resin.

A pair of laminations to be set were positioned so that the two pieces of aluminum foil 3 were opposite to each other, and then the laminations were closely fitted onto the molding faces by externally absorbing the laminations via absorbing holes (not shown) formed in the respective metal mold parts 1 and 2. Next, the lead frame 5 on which the semiconductor element 4 was fixed was interposed between the metal mold parts 1 and 2, and then the metal parts were closed as shown in FIG. 2B. Under this condition, molding resin (not shown) was injected into the metal mold, and then heat-molding was performed to thereby obtain a semiconductor package as shown in FIG. 2C.

Figure 3:
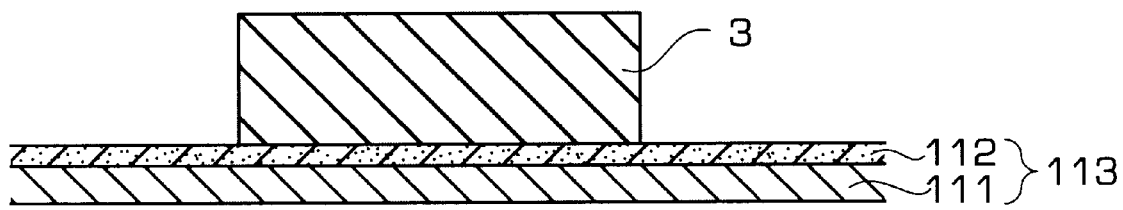
FIG. 3 is an enlarged sectional view showing a lamination used for manufacturing a semiconductor device according to the present invention.

In place of the above-mentioned lamination, another lamination as shown in FIG. 3 may be used. This lamination is constituted by aluminum foil (300 $\mu$m thick) acting as a fixing material being provisionally fixed on a surface of a resin layer 112 of a release film 113 which is constituted by a supporting film (50 $\mu$m thick polyester film) 111 and a provisionally fixing resin layer (phenoxy resin plus silicone graphite acrylic resin) 112 formed on the surface of the supporting film 111. The provisionally fixing resin layer 112 has release property (based on silicone graphite acrylic resin) with respect to the molding resin as well as the capability of provisionally fixing the aluminum foil (based on phenoxy resin).

INVENTIVE EXAMPLE 3

Aluminum foil (100 $\mu$m thick, 18 mm long×12 mm wide) acting as a fixing member was provisionally fixed, via a provisionally fixing adhesive agent layer made of a phenoxy resin and having a thickness of 10 $\mu$m, onto a central portion of a surface of a resin layer of a release film which was constituted by a supporting film (polyester film having thickness of 50 $\mu$m) and a silicone resin layer having a thickness of 0.3 $\mu$m and formed on a surface of this supporting film. Then, an epoxy resin compound was formed to a thickness of 0.1 mm on this resin layer and aluminum foil to thereby produce a molding resin layer to obtain a composite sheet.

Subsequently, the composite sheet was set so that the two pieces of aluminum foil were positioned in opposition to each other on the molding faces of the opened metal mold parts respectively, and a lead frame on which a semiconductor element was fixed was interposed between the metal mold parts. Then heat-molding was performed to obtain a semiconductor package.

In this inventive example, since it is not required to inject resin into the metal mold, no resin which does not eventually contribute to the package remains in the injection path or elsewhere. As a result, it is possible to manufacture the device at low cost and without polluting the work environment.

Furthermore, it was confirmed that the above-described manufacturing method using the composite sheet in which the thickness of the molding resin layer was selected to be 0.1 mm and the method in which resin was injected at the time of molding can be employed in simultaneous combination.

There are no specific limitations on the molding/working method of the present invention, and, for instance, transfer molding, injection molding, etc., may be applied thereto.

The term "provisional fixing of the fixing material" in the present invention means such fixing characteristics that the fixing material is not dropped out from the metal mold or the release film even in the opening/closing operation of the metal mold, and the fixing material can be easily separated from the metal mold or from the release film after the resin molding. Accordingly, as a provisional fixing means, not only a substance such as an adhesive agent may be employed, but also a method using magnetic force or absorbing force may be employed.

As the molding resin employed in the semiconductor device manufacturing method of the present invention, namely as the packaging resin used to seal the semiconductor device, a well known thermosetting resin, such as epoxy resin, phenol resin, urea resin, melamine resin, polyester resin, diallyl phthalate resin, polyphenylene sulphade resin, or the like, may be used. Of them, it is preferable to use the epoxy resins, and in this case, known additive agents such as a hardening agent, an accelerator, a filler, a release agent, etc., are provided to the epoxy resins, and the resulting material is used as an epoxy resin composition for sealing a semiconductor device.

In the molding resin, a release agent, such as silicone oil, wax or the like, having a release effect with respect to the metal mold, may be contained at a ratio in a range of from 0.01 to 5% by weight.

As the adhesive agent to be used when provisional fixing is performed by using an adhesive agent, since the temperature of the metal mold becomes high, a thermally melting adhesive agent such as wax, phenoxy resin, a copolymer of ethylene and vinyl acetate, and polyester resin, or a thermosetting adhesive agent such as epoxy resin may be utilized. The thickness of the adhesive agent layer is selected to be in a range of from 5 μm to 100 μm, preferably in a range of from 10 μm to 50 μm. It is to be understood that the adhesive agent defined in this specification includes a pressure-sensitive adhesive agent.

The above-described adhesive agent should have properties which allow it to be provisionally fixed on the metal mold or release film which is heated to a high temperature, and allow it to prevent the fixing material from being displaced by the injection pressure at the time of injection of the molding resin. The adhesive agent should have a further property that after the package molding, the semiconductor device can be separated and taken out from the molding faces of the metal mold or from the surfaces of the release films in good condition, without occurrence of cohesive failure in the adhesive agent layer around the boundary separation between the adhesive agent layer and the molding face of the metal mold or between the adhesive agent layer and the surface of the mold release film.

These requirements can be achieved by selecting an adhesive agent which has tension shear strength within a range of from 0.08 to 12.0 Kgf/cm$^2$, preferably from 0.10 to 5.0 Kgf/cm$^2$, and practically from 0.2 to 1.0 Kgf/cm$^2$, with respect to a #280 polished stainless steel plate according to JIS K6850 (Japanese Industrial Standards).

As the fixing material, any kind of material may be used so long as it has a melting point not lower than 300° C. in order to be able to endure the temperature of resin and the temperature of the metal mold during molding. For instance, metals such as aluminum, stainless, copper, nickel, and so on are preferable. Alternatively, low moisture absorbing resin such as polycarbodiimide, polytetrafluoroethylene, or the like, may be employed. Further, alternatively, an inorganic substance may be employed. The thickness of the fixing material is set be in a range of from 1 to 500 μm, preferably from 5 to 200 μm. If the thickness of the fixing material is not more than 1 μm, handling is difficult, while if it exceeds 500 μm, the actual thickness of the resin enclosing the semiconductor element decreases correspondingly so that the flow of this resin becomes poor.

Individual identifying information such as a product name, a manufacturing lot number, etc., of a semiconductor device may be formed on the surface of the fixing material. This individual identifying information may be formed before or after the molding. Although this identifying information may be recorded by way of a general recording method, for instance, laser marking, stamping, or the like, it is preferable to use photosensitive resin in view of recording of a large quantity of information, automatic recognition, and so on. This method comprises steps of: forming a photosensitive resin layer on the surface of a fixing material by using photosensitive resin, and irradiating the photosensitive resin layer with active light rays via a mask film by way of an ultraviolet (UV) exposing method to thereby record individual identifying information.

As the above-described photosensitive resin, for example, acrylic resin, epoxy resin, polyimide resin or the like may be used. However, polyimide resin is preferable because of its property of thermal resistance. The thickness of the recorded layer is selected to be in a range of from 0.1 to 10 μm, preferably from 1 to 5 μm. When the individual identifying information is recorded, it is preferable to use metal foil as the fixing material, and it is preferable to use photosensitive resin which has one of the following characteristics: 1) The surface glossiness of the metal foil is in a range of from 70 to 250% under JIS Z 8741 (Japanese Industrial Standards), or 2) the average surface roughness is in a range of from 0.1 to 19 μm.

By use of such metal foil, an adverse influence caused by unnecessary reflected light can be eliminated so that the individual identifying information can be correctly recognized at a wide visual angle.

Any release film may be used with no special limitation so long as it is capable of withstanding the temperature (usually, in a range of from 150 to 250° C.) during molding, and has substantially no adhesive force with respect to the molding resin. Specifically, it is possible to use a thermal resistance film, such as a polyester film, a polyimide film, or the like, coated over its surface with a thermal resistance release agent, such as silicone resin, or the like, to a thickness of about 0.1 to 5 μm; a thermal resistance film, such as a polymethylepenten film, a polytetraphloroethylene film, or the like, whose base has release property may be used. The thickness of the film is selected to be in a range of from 10 to 100 μm, preferably, from 25 to 75 μm.

The area of the coating with the fixing materials is not less than 20% of the overall area of the plastic package, preferably not less than 50% of the same, and more preferably not less than 75% of the same. By coating the plastic package with the fixing materials by an area not less than 20%, it is possible to obtain improvements in the reliability in the TCT test of the semiconductor device and in the anti-crack characteristic when the semiconductor device is dipped in molten solder. This effect is remarkable in the case where an area not less than 50% of the plastic package is coated.

The lamination used in the foregoing second manufacturing method is constituted, as described above, by a release film, a provisionally fixing adhesive agent formed on this film, and a fixing material provided on this adhesive agent. Alternatively, the stacked member may be constituted by: a release film constituted by a supporting film, such as a polyester film, a polyimide film, or the like, and a resin layer which has release property with respect to molding resin and onto which a fixing member can be provisionally fixed (that is, the release film is composed of a release property component and an adhesive component); and a fixing member provisionally fixed on the release film.

In the foregoing third manufacturing method, as described above, a composite sheet is used which is constituted by a release film, a provisionally fixing adhesive agent is provided on this release film, a fixing material is provided on the adhesive agent, and a molding resin layer is formed on the film and the fixing material. The thickness of the resin layer is selected to be in a range of from 0.1 to 1 mm. In the molding method using such a composite sheet, molding resin may be further injected into the metal mold.

The fixing materials provisionally fixed on the molding faces of the metal mold or on the surfaces of the release films are joined directly to the surface of the package after the resin is molded. The fixing materials have functions to prevent the resin from absorbing moisture, and to reduce thermal shocks which are caused when a semiconductor device is dipped in molten solder after the semiconductor device is mounted on a printed circuit board. Further, by recording individual identifying information on the surface of the fixing material, the fixing member may be utilized as an information recording label.

The outer appearance of the semiconductor device manufactured in accordance with the manufacturing method of the present invention has a feature that the surface of the fixing materials is even with or slightly lowered than the surface of the resin.

What is claimed is:

1. A lamination for use in a semiconductor device manufacturing method in which a fixing material is fixed on a surface of a package in which a semiconductor element is sealed with molding resin, the lamination comprising:

the fixing material;

an adhesive agent layer; and a release film having mold release property with respect to the molding resin;

wherein the adhesive agent layer is formed on said release film and the fixing material is formed on said adhesive agent layer.

2. A lamination for use in a semiconductor device manufacturing method in which a fixing material is fixed on a surface of a package in which a semiconductor element is sealed with molding resin, the lamination comprising:

a release film and the fixing material;

wherein the release film comprises:

a support film; and a resin layer, provided on said support film, which has mold releasing property with respect to the molding resin and on which the fixing material can be provisionally fixed, wherein the fixing material is formed on said resin layer.

3. A lamination for use in a semiconductor device manufacturing method in which a fixing material is fixed on a surface of a package in which a semiconductor element is sealed with molding resin, the lamination comprising:

the fixing material;

a release film; and a layer of the molding resin, wherein said release film is layered between said layer of the molding resin and said fixing material.

4. The lamination as set forth in any one of claims 1–3, wherein individual identification information is formed on a surface of said fixing material.

5. The lamination as set forth in any one of claims 1–3, wherein a surface of said fixing material is provisionally fixed by an adhesive agent layer to one of a surface of a package-forming metal mold and a surface of a release film.

6. A fixing material of a semiconductor device manufacturing method in which said fixing material is a metal film embedded in opposed surfaces of a package in which a semiconductor element is sealed with molding resin, wherein individual identification information is formed on a surface of said fixing material, and further wherein a surface of said fixing material is provisionally fixed by an adhesive agent layer to one of a surface of a package-forming metal mold and a surface of a release film, and still further wherein said fixing material is resistant to moisture and heat.

7. The fixing material as set forth in claim 6, wherein the fixing material is metal foil.

8. The fixing material as set forth in claim 6, wherein said metal film has a thickness in the range of about 5 $\mu$m to 200 $\mu$m.

9. A semiconductor device comprising:

a moisture and heat resisting material embedded in opposed surfaces of a package in which a semiconductor element is sealed with molding resin, wherein a surface of said moisture and heat resisting material is provisionally fixed by an adhesive agent layer to one of a surface of a package-forming metal mold and a surface of a release film.

10. A semiconductor device as set forth in claim 9, wherein said moisture resisting material is metal foil.

11. The semiconductor device as set forth in claim 9, wherein said moisture resisting material is a sheet of material selected from the group consisting of: aluminum, stainless steel, copper, and nickel.

12. The semiconductor device as set forth in claim 9, wherein said moisture resisting material is a sheet of low moisture absorbing resin.

13. The semiconductor device as set forth in claim 12, wherein said low moisture absorbing resin is selected from the group consisting of: polycarbodiimide and polytetrafluoroethylene.

* * * * *